United States Patent
Hansen et al.

(10) Patent No.: US 8,952,764 B2
(45) Date of Patent: Feb. 10, 2015

(54) HIGH-FREQUENCY, HIGH-SPEED PRECISION DIGITAL BI-PHASE MODULATOR AND METHOD FOR BI-PHASE MODULATION

(75) Inventors: Bradley O. Hansen, Vail, AZ (US);
Michael R. Beylor, Vail, AZ (US);
Daniel R. Bruns, Tucson, AZ (US);
Lloyd Cox, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 350 days.

(21) Appl. No.: 13/415,989

(22) Filed: Mar. 9, 2012

(65) Prior Publication Data
US 2013/0234803 A1 Sep. 12, 2013

(51) Int. Cl.
*H03C 3/00* (2006.01)

(52) U.S. Cl.
USPC ............ 332/144; 332/103; 332/104; 332/105

(58) Field of Classification Search
USPC .......... 332/103, 104, 105, 144; 375/279, 282, 375/308
See application file for complete search history.

(56) References Cited

U.S. PATENT DOCUMENTS

| | | | |
|---|---|---|---|
| 4,130,802 A * | 12/1978 | Nossen et al. | 375/282 |
| 4,843,331 A | 6/1989 | Yang | |
| 5,453,720 A | 9/1995 | Mccullough, Jr. et al. | |
| 2005/0105637 A1 * | 5/2005 | Fitzpatrick et al. | 375/295 |
| 2009/0115545 A1 * | 5/2009 | Lan et al. | 332/109 |
| 2010/0195765 A1 * | 8/2010 | Lin et al. | 375/308 |

* cited by examiner

*Primary Examiner* — Joseph Chang
*Assistant Examiner* — Jeffrey Shin
(74) *Attorney, Agent, or Firm* — Schwegman Lundberg & Woessner, P.A.

(57) ABSTRACT

Embodiments of digital high-speed bi-phase modulator and method for bi-phase modulation are generally described herein. In some embodiments, the digital high-speed bi-phase modulator comprises a high-speed digital divider, a high-speed digital multiplexer, and matched signal paths provided between the divider and the multiplexer. The high-speed digital divider is configured to receive a carrier signal and generate complementary output signals. The high-speed digital multiplexer is configured to switch between the complementary output signals and generate a bi-phase modulated output at a carrier frequency ($f_c$) modulated with a bi-phase code. The bi-phase code may be provided to control inputs of the multiplexer.

23 Claims, 1 Drawing Sheet

HIGH-FREQUENCY, HIGH-SPEED PRECISION DIGITAL BI-PHASE MODULATOR AND METHOD FOR BI-PHASE MODULATION

GOVERNMENT RIGHTS

This invention was not made with United States Government support. The United States Government does not have certain rights in this invention.

TECHNICAL FIELD

Embodiments pertain to radio-frequency (RF) circuitry. Some embodiments relate to high-speed digital circuitry. Some embodiments relate to generating bi-phase modulated signals. Some embodiments relate to receivers and seekers.

BACKGROUND

Bi-phase modulation is important for many electronic devices and systems which require digital coding of radio frequency signals, such as pseudo-noise (PN) coded signals. Bi-phase modulation is often required in devices and systems constrained with small size, low power consumption and robust operation in a broad variety of operational environments. Examples of such devices and systems include munitions, fuzes, radar systems and communications systems.

One issue with conventional bi-phase modulators is that many use analog circuits. As a result, conventional bi-phase modulators are frequency sensitive and require tuning. Furthermore, imbalance in the drive circuits results in a less than ideal output waveform. These issues become more significant at higher-frequency and higher-speed applications.

Thus there are general needs for bi-phase modulators and methods for generating bi-phase modulated signals that are less frequency sensitive and require little or no tuning. There are general needs for bi-phase modulators and methods for generating bi-phase modulated signals that are able to generate a more ideal bi-phase modulated output waveform. There are general needs for bi-phase modulators and methods for generating bi-phase modulated signals suitable for higher-frequency and higher-speed applications.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
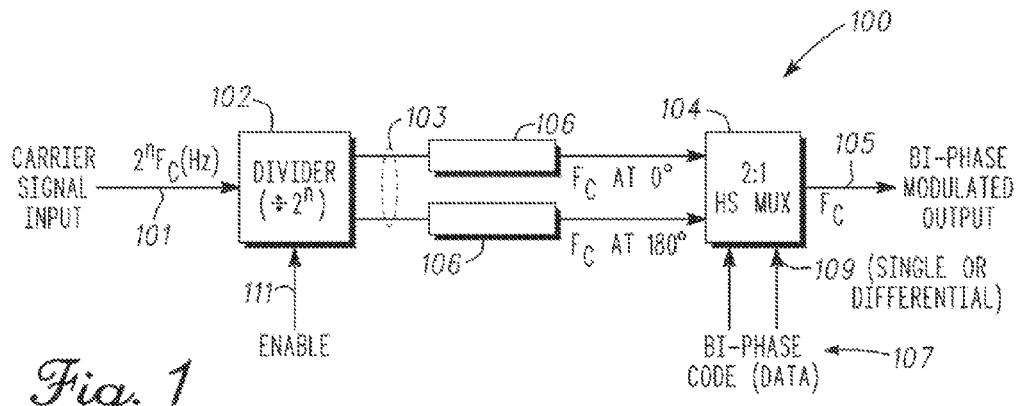
FIG. 1 is a block diagram of a digital high-speed bi-phase modulator in accordance with some embodiments.

FIG. 1 is a block diagram of a digital high-speed bi-phase modulator in accordance with some embodiments. Digital high-speed bi-phase modulator 100 comprises a high-speed digital divider 102, a high-speed digital multiplexer 104, and matched signal paths 106 provided between the divider 102 and the high-speed digital multiplexer 104.

The high-speed digital divider 102 is configured to receive a carrier signal 101 and generate complementary output signals 103. In these embodiments, the high-speed digital divider 102 is a divide-by $2^n$ ($\div 2^n$) divider. The high-speed digital multiplexer 104 is configured to switch between one of two complementary output signals 103 and generate a bi-phase modulated output 105 at a carrier frequency ($f_c$) modulated with a bi-phase code 107. In these embodiments, the bi-phase code 107 may be provided to control inputs 109 of the multiplexer 104. The matched signal paths 106 provided between the divider 102 and the multiplexer 104 are to couple the complementary output signals 103 from the divider 102 to the multiplexer 104.

Unlike many conventional bi-phase modulators, embodiments of the digital high-speed bi-phase modulator 100 disclosed herein may be all-digital and may require little or no tuning. Furthermore, the digital high-speed bi-phase modulator 100 does not require multiple digital gates and does not require delay lines. Furthermore, it may be less temperature and frequency sensitive and less bandwidth limited than many conventional bi-phase modulators. The digital high-speed bi-phase modulator 100 may also be able to generate bi-phase modulated signals that have more ideal bi-phase modulated output waveform. The digital high-speed bi-phase modulator 100 may also be suitable for higher-frequency and higher-speed applications.

In some embodiments, the high-speed digital divider 102 and the high-speed digital multiplexer 104 may comprise high-speed digital logic circuitry. The high-speed digital divider 102 may have complementary logic outputs to generate the complementary output signals 103 that have a complementary phase relationship. The complementary output signals 103 may have a complementary 0-180 degree phase relationship.

In these embodiments that use high-speed digital logic circuitry, the high-speed digital divider 102 may capable of dividing signals having frequencies of up to 10 GHz and greater and generating a bi-phase modulated output 105 having a carrier frequency of at least 5 GHz for a bi-phase code rate of 1 GHz.

Conventional bi-phase modulators, on the other hand, use analog circuits such as a mixer and require the use of a drive to translate the digital waveform signal (e.g., the bi-phase code) to an analog signal for the mixer. In these conventional bi-phase modulators, the polarity of the drive currents defines the phase states. The drive circuits generally have some imbalances, such as DC offsets, imbalance in duty cycle, and rise and fall time differences. These imbalances in the drive as well as the use of an analog mixer contribute to distortion of the bi-phase modulated output. Furthermore, these conventional circuits are frequency dependent and require tuning.

In accordance with embodiments, the digital high-speed bi-phase modulator 100 uses a high-speed digital divider 102 and a high-speed digital multiplexer 104 that comprise high-speed digital logic circuitry. The use of high-speed digital logic circuitry significantly reduces and may even eliminate such distortion to provide a more ideal waveform output. Furthermore, the use of high-speed digital logic circuitry eliminates any need for tuning.

In some embodiments, the bi-phase modulated output 105 is at a carrier frequency ($f_c$), and the carrier signal 101 has an input frequency of $2^n$ times the carrier frequency ($2^n f_c$). In these embodiments when the high-speed digital divider 102 is a divide-by $2^n$ (÷$2^n$) divider, n may be a whole number ranging from 1 to 4, although this is not a requirement as greater numbers for n may be used. In some embodiments, the matched signal paths 106 may have matched lengths that are matched for the frequency of operation (e.g., fc).

In some embodiments, the divider 102 includes a divider enable input 111 to inhibit the divider 102 from generating the complementary output signals 103 when enabled. In these embodiments, the use of the divider enable input 111 provides for on/off carrier frequency (Fc) suppression and may provide an RF blanking feature. When the enable input 111 is enabled, no output at 105 is generated as the carrier frequency is suppressed. Furthermore, since the high-speed digital divider 102 is a divide-by $2^n$ (÷$2^n$) divider, for n=1 (divide by 2 or greater), significant carrier frequency isolation is provided between the input and the output since the complementary output signals (Fc) 103 is not created.

In some embodiments, the high-speed digital multiplexer 104 is a 2:1 high-speed digital multiplexer. In some embodiments, the control inputs 109 of the high-speed digital multiplexer 104 comprise either a single ended control input or an inverted and a non-inverted control input. The bi-phase code 107 may be single ended or provided as a digital-differential signal to the inverted and the non-inverted control inputs. In some embodiments, the bi-phase code 107 may be provided at a data rate. The multiplexer also may provide a constant phase state when the bi-phase code 107 is held in one state unlike conventional bi-phase modulators eliminating the need for a bypass path while not being bi-phase modulated.

In some embodiments, the complementary output signals 103 may comprise complementary square waves with substantially a 50% duty cycle having a duty-cycle imbalance of less than 0.25%. In these embodiments, the divide-by $2^n$ divider may provide complementary square waves with a 50% duty cycle, with constant amplitude. In these embodiments, the complementary output signals 103 may have minimal phase imbalance, amplitude imbalance and duty-cycle imbalance which may provide a bi-phase modulated output signal with a high peak-to-sidelobe ratio and high carrier suppression. In some embodiments, the phase imbalance may be less than one degree, the amplitude imbalance may be less than 0.1 dB and the duty-cycle imbalance may be less than 0.25% which may result in a peak-to-sidelobe ratio of up to 13:1 (for a 13-bit Barker code) (i.e., −22 dBc) and a carrier suppression of up to −38 dBc or better.

In some embodiments, the high-speed digital divider 102 may be suitable for dividing signals having frequencies of at least 1 GHz and up to at least 10 GHz. The high-speed digital multiplexer 104 may be suitable for multiplexing signals of at least up to 5 GHz and generating a bi-phase modulated output 105 that is at least five times the data rate of the bi-phase code. In these embodiments, the data rate of the bi-phase code may be up to 1 GHz or greater.

In some embodiments, the high-speed digital logic circuitry may comprise high $F_t$ transistors. In these embodiments, transistors having a high transit frequency (Ft) may allow the device to operate at frequencies of up to 100 GHz or more. Examples of high $F_t$ transistors include heterojunction bipolar transistors (HBTs). HBTs use differing semiconductor materials for the emitter and base regions allowing their operating frequencies to reach several hundred GHz. The use of high-speed digital logic circuitry comprising HBTs allows the high-speed digital divider 102 to divide signals having a frequencies of at least up to 10 GHz, and allows the high-speed digital multiplexer 104 to operate on signals of at least up to 5 GHz and generate the bi-phase modulated output 105 that has a data rate of at least 1 GHz. In some of these embodiments, the high-speed digital logic circuitry may comprise SiGe, InGaP, InP or InGaAs semiconductor material.

In some of these embodiments, the carrier frequency may range from 1 GHz to 10 GHz and the bi-phase code 107 may be provided at a modulation or data rate that ranges from 10 MHz up to 1 GHz or more depending on the carrier frequency. In some embodiments, the bi-phase code 107 may comprise data for transmission over a data or communication link to a receiver. In some embodiments, the bi-phase modulated output 105 may comprise a BPSK modulated signal. In some embodiments, the bi-phase code 107 may comprise a pseudo-noise (PN) code.

Figure 2:
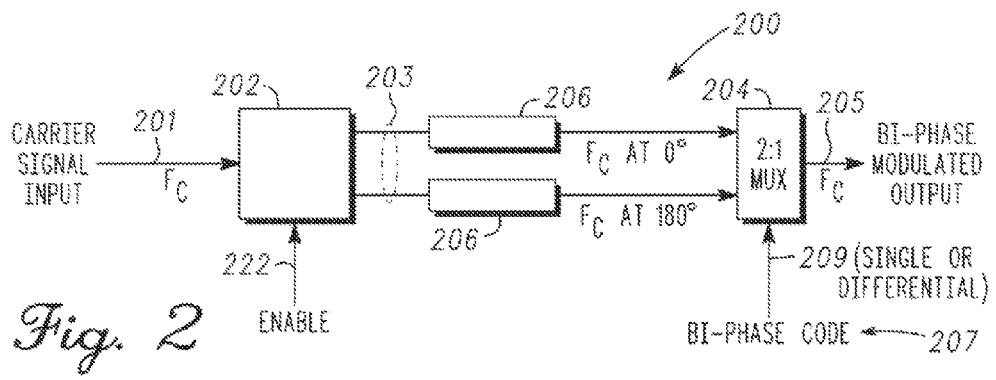
FIG. 2 is a block diagram of a digital high-speed bi-phase modulator in accordance with some alternate embodiments.

FIG. 2 is a block diagram of a digital high-speed bi-phase modulator in accordance with some alternate embodiments. Digital high-speed bi-phase modulator 200 comprises input circuitry 202, a multiplexer 204, and matched signal paths 206 provided between the input circuitry 202 and the multiplexer 204. In some embodiments, the input circuitry may include an enable input 222. The input circuitry 202 is to receive a carrier signal 201 and generate complementary output signals 203. The multiplexer 204 is to switch between the complementary output signals 203 and generate a bi-phase modulated output 205 at a carrier frequency ($f_c$) modulated with a bi-phase code 207. The matched signal paths 206 are to couple the complementary output signals 203 from the input circuitry 202 to the multiplexer 204. In some embodiments, the input circuitry 202 and the multiplexer 204 may comprise high-speed digital logic circuitry.

In some embodiments, the enable input 222 provides for on/off carrier frequency suppression and may provide an RF blanking feature. When the enable input 222 is enabled, no output signals are generated by input circuitry 202 however isolation may be limited by the physical separation of the carrier signal 201 at the input and the outputs of the input circuitry 202. Additional RF switches may be included for additional isolation.

In some of these embodiments, the input circuitry 202 may comprises one of a line driver, a differential amplifier, a prescaler, a limiting amp, and a flip-flop.

In some embodiments, the multiplexer 204 is a 2:1 multiplexer. In these embodiments, the multiplexer 204 may comprise several gates and operate as a digital switch. In these embodiments, the bi-phase code 207 may be provided to a control input 209 of the multiplexer 204.

In some other embodiments, the multiplexer 204 may comprise a single pole double throw (SPDT) RF switch. In these embodiments, the RF switch may comprise a single switching element or transistor, such as a field-effect transistor (FET), although this is not a requirement.

In some of these embodiments, when the input circuitry 202 is a divide-by-one divider, line driver, limiting amp, differential amp or a flip-flop, reduced frequency isolation between the input and the output may result. For improved frequency isolation, multiple RF switches may be used.

Figure 3:
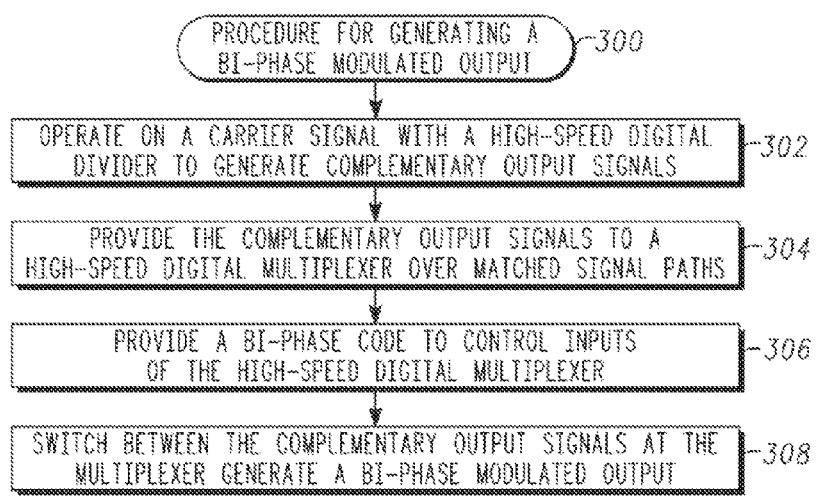
FIG. 3 is a flow chart of a procedure for generating a bi-phase modulated output in accordance with some embodiments.

FIG. 3 is a flow chart of a procedure for generating a bi-phase modulated output in accordance with some embodiments. Procedure 300 may be performed by a bi-phase modulator, such as the digital high-speed bi-phase modulator 100 (FIG. 1), although other bi-phase modulator configurations may also be suitable.

Operation 302 comprises operating on a carrier signal with a high-speed digital divider to generate complementary output signals. Operation 302 may be performed by high-speed digital divider 102 (FIG. 1).

Operation 304 comprises providing the complementary output signals to a high-speed digital multiplexer over matched signal paths. The matched signal paths 106 (FIG. 1) may be used to perform operation 304.

Operation 306 comprises receiving a bi-phase code at control inputs of the high-speed digital multiplexer.

Operation 308 comprises switching between the complementary output signals at the multiplexer to generate a bi-phase modulated output. Operations 306 and 308 may be performed by high-speed digital multiplexer 104 (FIG. 1).

In some embodiments, the digital high-speed bi-phase modulator 100 may be part of a communication device, such as a transmitter or receiver. In some embodiments, the digital high-speed bi-phase modulator 100 (FIG. 1) may be part of a munition, a fuze, a seeker, or part of a radar or communication system. In some embodiments, the digital high-speed bi-phase modulator 100 may be part of an autotrack modulator.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A digital high-speed bi-phase modulator comprising:
   a high-speed digital divider to receive a carrier signal and generate complementary output signals, wherein the high-speed digital divider is a divide-by $2^n$ ($\div 2^n$) divider;
   a high-speed digital multiplexer to switch between the complementary output signals and generate a bi-phase modulated output at a carrier frequency ($f_c$) modulated with a bi-phase code, wherein the bi-phase code is provided to control inputs of the multiplexer and comprises a pseudo-noise (PN) code; and
   matched signal paths provided between the divider and the multiplexer to switch between the complementary output signals from the divider to the multiplexer.

2. The digital high-speed bi-phase modulator of claim 1, wherein the high-speed digital divider and the high-speed digital multiplexer comprise high-speed digital logic circuitry, and
   wherein the high-speed digital divider has complementary logic outputs to generate the complementary output signals that have a complementary phase relationship.

3. The bi-phase modulator of claim 2, wherein the carrier signal has an input frequency of $2^n$ times the carrier frequency ($2^n f_c$).

4. A digital high-speed bi-phase modulator comprising:
   a high-speed digital divider to receive a carrier signal and generate complementary output signals, wherein the high-speed digital divider is a divide-by $2^n$ ($\div 2^n$) divider;
   a high-speed digital multiplexer to switch between the complementary output signals and generate a bi-phase modulated output at a carrier frequency ($f_c$) modulated with a bi-phase code, wherein the bi-phase code is provided to control inputs of the multiplexer; and
   matched signal paths provided between the divider and the multiplexer to switch between the complementary output signals from the divider to the multiplexer,
   wherein the high-speed digital divider and the high-speed digital multiplexer comprise high-speed digital logic circuitry,
   wherein the high-speed digital divider has complementary logic outputs to generate the complementary output signals that have a complementary phase relationship,
   wherein the carrier signal has an input frequency of $2^n$ times the carrier frequency ($2^n f_c$), and
   wherein the divider includes a divider enable input to inhibit the divider from generating the complementary output signals when enabled.

5. The digital high-speed bi-phase modulator of claim 4, wherein the high-speed digital multiplexer is configured to provide an output having a constant phase state when the bi-phase code is held in one state.

6. The bi-phase modulator of claim 5, wherein the high-speed digital multiplexer is a 2:1 high-speed digital multiplexer.

7. The bi-phase modulator of claim 6, wherein the control inputs of the high-speed digital multiplexer comprises either single ended or an inverted and a non-inverted control input, and
   wherein the bi-phase code having a data rate is provided as a digital-differential signal to the inverted and the non-inverted control inputs.

8. The bi-phase modulator of claim 7, wherein the complementary output signals comprise complementary square waves with substantially a 50% duty cycle having a duty-cycle imbalance of less than 0.25%.

9. The digital high-speed bi-phase modulator of claim 8, wherein the high-speed digital divider is configured to divide signals having frequencies of at least 1 GHz and up to at least 10 GHz, and
   wherein the high-speed digital multiplexer is configured to multiplex signals of at least up to 5 GHz and generate the bi-phase modulated output that is at least five times the data rate of the bi-phase code.

10. The digital high-speed bi-phase modulator of claim 4, wherein the high-speed digital logic circuitry comprise transistors having a transit frequency (Ft) for up to 100 GHz operation.

11. The digital high-speed bi-phase modulator of claim 10, wherein the transistors comprise heterojunction bipolar transistors (HBTs).

12. The digital high-speed bi-phase modulator of claim 11, wherein the high-speed digital logic circuitry comprise one of SiGe, InGaP, InP and InGaAs semiconductor material.

13. A digital high-speed bi-phase modulator comprising:
    input circuitry to receive a carrier signal and generate complementary output signals;
    a multiplexer to switch between the complementary output signals and generate a bi-phase modulated output at a carrier frequency ($f_c$) modulated with a bi-phase code that comprises a pseudo-noise (PN) code; and
    matched signal paths provided between the input circuitry and the multiplexer to couple the complementary output signals from the input circuitry to the multiplexer.

14. The digital high-speed bi-phase modulator of claim 13, wherein the multiplexer is a 2:1 multiplexer, and
    wherein the bi-phase code is provided to control inputs of the multiplexer.

15. The digital high-speed bi-phase modulator of claim 14, wherein the input circuitry is one of a divide-by-one divider, line driver, limiting amp, differential amp, flip-flop or high speed logic configured to generate 50% duty cycle complementary outputs.

16. The digital high-speed bi-phase modulator of claim 14, wherein the multiplexer comprises an RF switch.

17. A method for generating a bi-phase modulated output, the method comprising:
    operating on a carrier signal with a high-speed digital divider to generate complementary output signals, wherein the high-speed digital divider is a divide-by $2^n$ ($\div 2^n$) divider;

providing the complementary output signals over matched signal paths to a high-speed digital multiplexer;

providing a bi-phase code comprising a pseudo-noise (PN) code to control inputs of the high-speed digital multiplexer; and switching between the complementary output signals at the high-speed digital multiplexer to generate the bi-phase modulated output at a carrier frequency ($f_c$) modulated with the bi-phase code.

18. The method of claim 17, further comprising providing an output having a constant phase state when the bi-phase code is held in one state.

19. The method of claim 17, wherein the high-speed digital divider and the high-speed digital multiplexer comprise high-speed digital logic circuitry, and wherein the complementary output signals are provided by complementary logic outputs of the high-speed digital divider.

20. The method of claim 19, wherein the carrier signal has an input frequency of $2^n$ times the carrier frequency ($2^n f_c$).

21. A method for generating a bi-phase modulated output, the method comprising:

operating on a carrier signal with a high-speed digital divider to generate complementary output signals, wherein the high-speed digital divider is a divide-by $2^n$ ($\div 2^n$) divider;

providing the complementary output signals over matched signal paths to a high-speed digital multiplexer;

providing a bi-phase code to control inputs of the high-speed digital multiplexer; and switching between the complementary output signals at the high-speed digital multiplexer to generate the bi-phase modulated output at a carrier frequency ($f_c$) modulated with the bi-phase code, wherein the high-speed digital divider and the high-speed digital multiplexer comprise high-speed digital logic circuitry, wherein the complementary output signals are provided by complementary logic outputs of the high-speed digital divider, wherein the carrier signal has an input frequency of $2^n$ times the carrier frequency ($2^n f_c$), and wherein the method further comprises inhibiting the divider from generating the complementary output signals by enabling a divider enable input.

22. The method of claim 21, wherein the high-speed digital multiplexer is a 2:1 high-speed digital multiplexer.

23. The method of claim 22, wherein the control inputs of the high-speed digital multiplexer comprises either a single ended or an inverted and a non-inverted control input, and wherein the bi-phase code having a data rate is provided as a digital-differential signal to the inverted and the non-inverted control inputs.

* * * * *